United States Patent
Van Keymeulen et al.

(10) Patent No.: US 10,149,381 B2
(45) Date of Patent: Dec. 4, 2018

(54) TEXTILE INTEGRATION OF ELECTRONIC CIRCUITS

(71) Applicant: IMEC vzw, Leuven (BE)

(72) Inventors: Bjorn Van Keymeulen, Zottegem (BE); Frederick Bossuyt, Ghent (BE); Thomas Vervust, Ghent (BE)

(73) Assignees: IMEC vzw, Leuven (BE); Universiteit Gent, Ghent (BE)

( * ) Notice: Subject to any disclaimer, the term of this patent is extended or adjusted under 35 U.S.C. 154(b) by 421 days.

(21) Appl. No.: 14/752,576

(22) Filed: Jun. 26, 2015

(65) Prior Publication Data

US 2016/0100480 A1    Apr. 7, 2016

Related U.S. Application Data

(63) Continuation of application No. PCT/EP2014/052753, filed on Feb. 12, 2014.

(Continued)

(51) Int. Cl.
H05K 1/03 (2006.01)
H05K 1/02 (2006.01)
(Continued)

(52) U.S. Cl.
CPC .......... H05K 1/038 (2013.01); H05K 1/0283 (2013.01); H05K 1/189 (2013.01); H05K 3/0026 (2013.01);
(Continued)

(58) Field of Classification Search
CPC ........ A41D 1/005; A41D 1/002; H05K 1/038; H05K 1/0283; H05K 1/189; H05K 3/0026;
(Continued)

(56) References Cited

U.S. PATENT DOCUMENTS 6,150,726 A * 11/2000 Feilchenfeld ............. G03F 7/00
257/668
6,381,482 B1 * 4/2002 Jayaraman ........... A61B 5/6805
600/388

(Continued)

FOREIGN PATENT DOCUMENTS

DE    2007 001411    7/2008
DE    10 2011 005606    3/2012
(Continued)

OTHER PUBLICATIONS

Debaets, Integrated Platform for Advanced Smart Textile Applications, Platform for Advanced Smart Textile Applications, 1 pg.
(Continued)

*Primary Examiner* — Peter DungBa Vo
*Assistant Examiner* — Jeffrey Carley
(74) *Attorney, Agent, or Firm* — Knobbe Martens Olson & Bear LLP

(57) ABSTRACT

The present disclosure relates to a method of integrating a interposer device with a textile layer, wherein the interposer device is a stretchable interposer device comprising a stretchable electrically conductive structure with at least one contact pad for establishing at least one electrically conductive path towards the textile layer. The interposer device is arranged to be mechanically attached to a textile layer comprising a plurality of yarns, at least one of which is an electrically conductive yarn. An electrical connection is established between the at least one conductive yarn of the textile layer and the at least one contact pad, which electrical connection is established after the interposer device has been mechanically attached to the textile layer.

20 Claims, 13 Drawing Sheets

Related U.S. Application Data

(60) Provisional application No. 61/765,533, filed on Feb. 15, 2013.

(51) Int. Cl.
  *H05K 1/18* (2006.01)
  *H05K 3/32* (2006.01)
  *H05K 3/00* (2006.01)
  *H05K 3/46* (2006.01)
  *A41D 1/00* (2018.01)

(52) U.S. Cl.
  CPC ............. *H05K 3/321* (2013.01); *H05K 3/46* (2013.01); *A41D 1/002* (2013.01); *H05K 2201/0263* (2013.01); *H05K 2201/0969* (2013.01); *H05K 2201/10977* (2013.01); *H05K 2203/107* (2013.01)

(58) Field of Classification Search
  CPC .... H05K 3/321; H05K 3/46; Y10T 29/49147; Y10T 29/49155
  See application file for complete search history.

(56) References Cited

U.S. PATENT DOCUMENTS

| | | | | |
|---|---|---|---|---|
| 6,687,523 | B1* | 2/2004 | Jayaramen | A41D 13/1281 600/388 |
| 8,752,285 | B2* | 6/2014 | Son | H01L 23/49827 174/262 |
| 2004/0224138 | A1* | 11/2004 | Farrell | B32B 3/08 428/209 |
| 2006/0258205 | A1* | 11/2006 | Locher | H05K 1/038 439/517 |
| 2007/0026695 | A1* | 2/2007 | Lee | H01R 12/592 439/37 |
| 2008/0157235 | A1* | 7/2008 | Rogers | H01L 21/8258 257/415 |
| 2009/0317639 | A1* | 12/2009 | Axisa | B32B 37/185 428/411.1 |
| 2011/0100683 | A1 | 5/2011 | Bhattacharya et al. | |
| 2011/0226515 | A1* | 9/2011 | Son | H01L 23/49827 174/259 |
| 2013/0041235 | A1* | 2/2013 | Rogers | A61B 5/6867 600/306 |

FOREIGN PATENT DOCUMENTS

| | | |
|---|---|---|
| FR | 2962593 A1 | 1/2012 |
| WO | WO 2014/124986 | 8/2014 |

OTHER PUBLICATIONS

Gonzalez, et al, Design and implementation of flexible and stretchable systems, Microelectronics Reliability 51 (2011), pp. 1069-1076.

Linz, et al., Contacting electronics to fabric circuits with nonconductive adhesive bonding, The Journal of the Textile Institute, vol. 103, No. 10, Oct. 2012, pp. 1139-1150.

International Search Report and Written Opinion for PCT/EP2014/052753, dated May 7, 2014.

Communication Pursuant to Article 94(3) EPC in European Application No. 14 703 896.2, dated Oct. 26, 2017.

\* cited by examiner

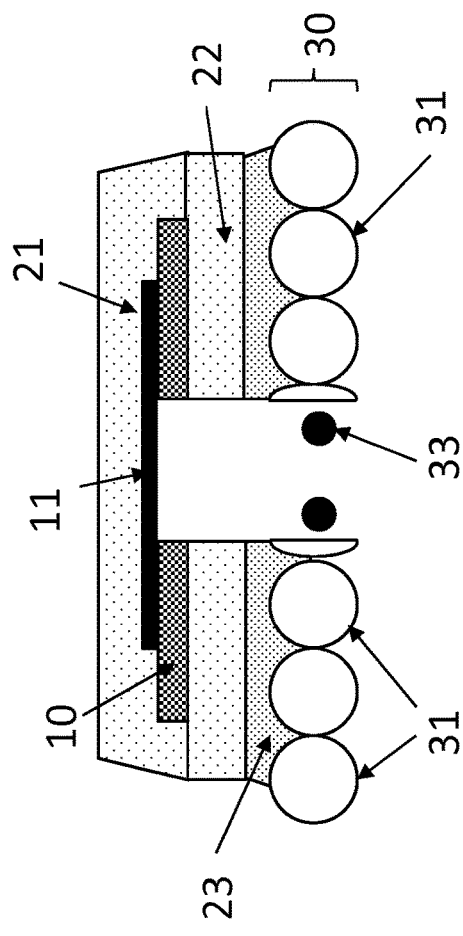
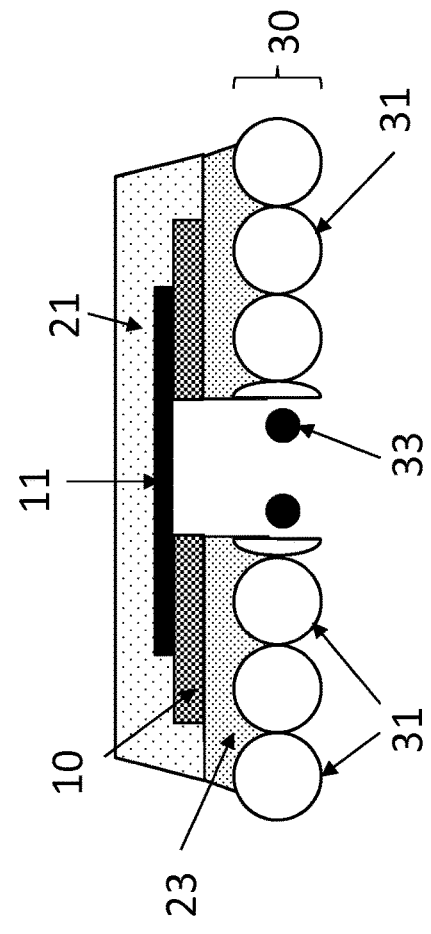
FIG. 3A
FIG. 3B

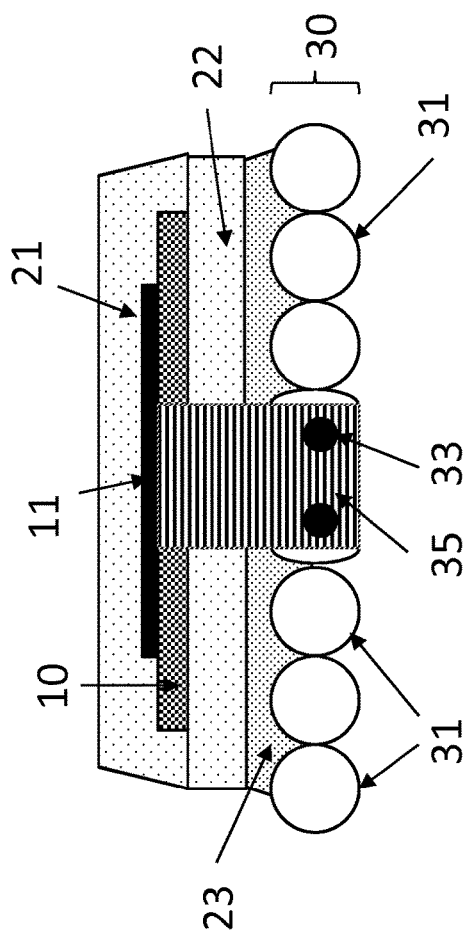
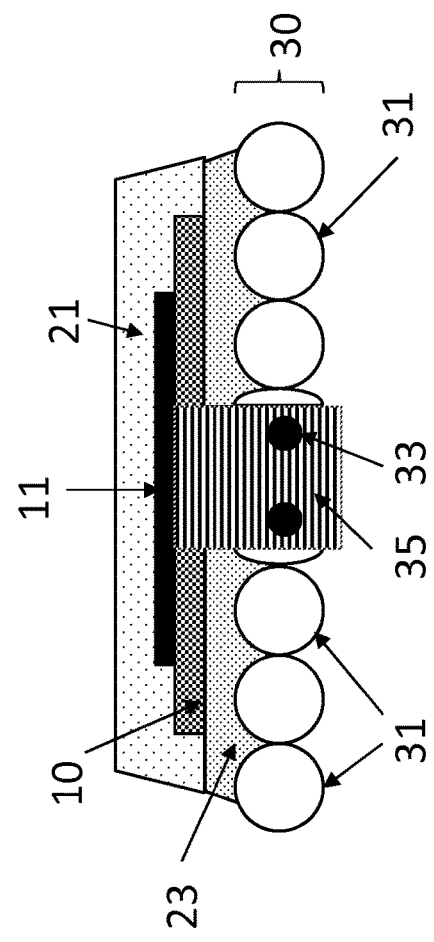
FIG. 4A
FIG. 4B

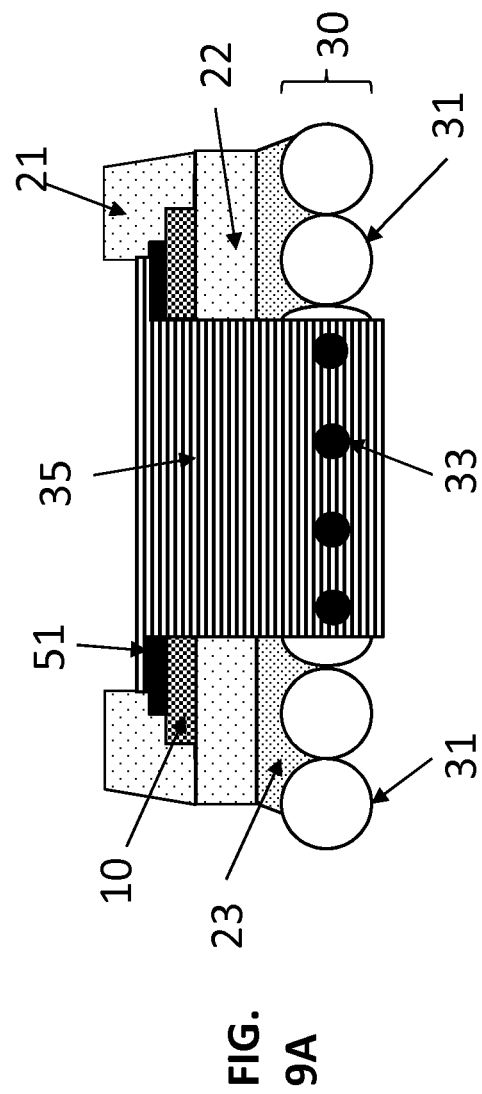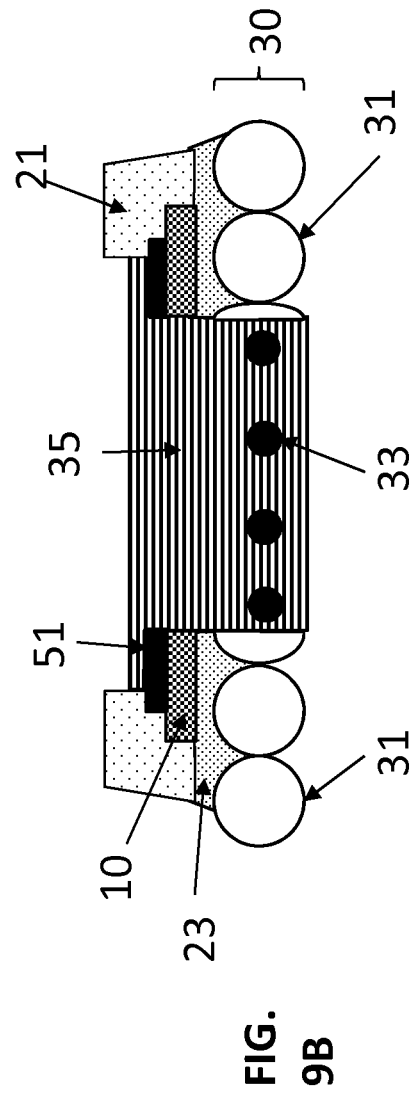
FIG. 9A
FIG. 9B

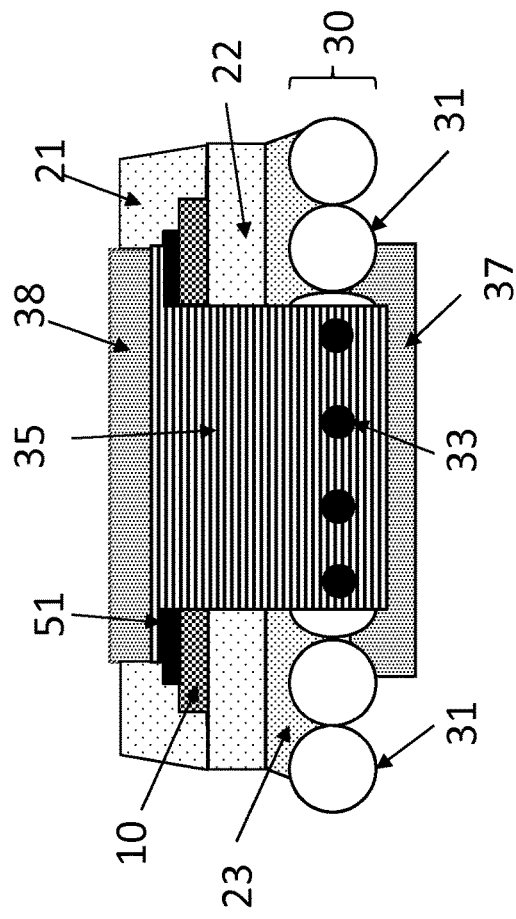
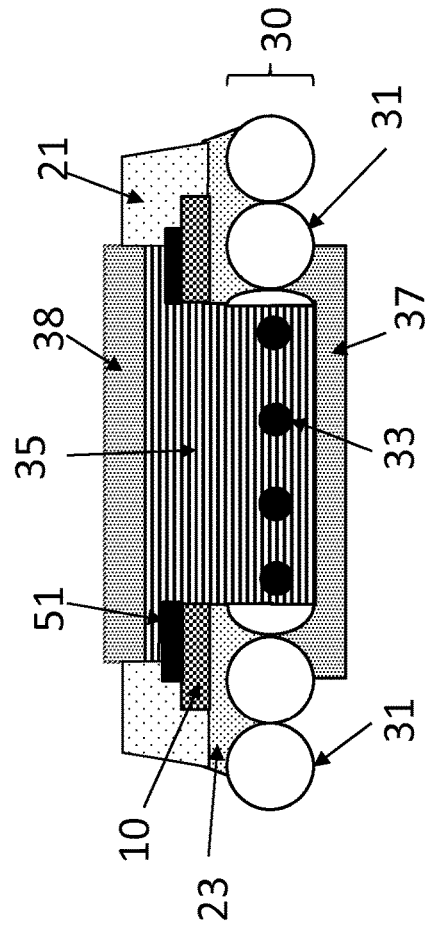
FIG. 10A
FIG. 10B

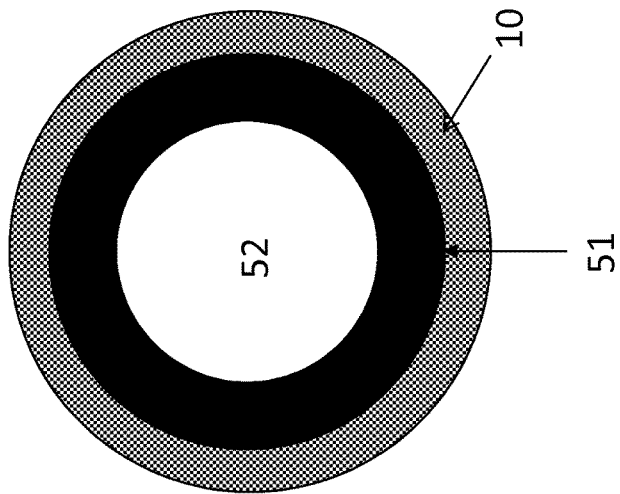
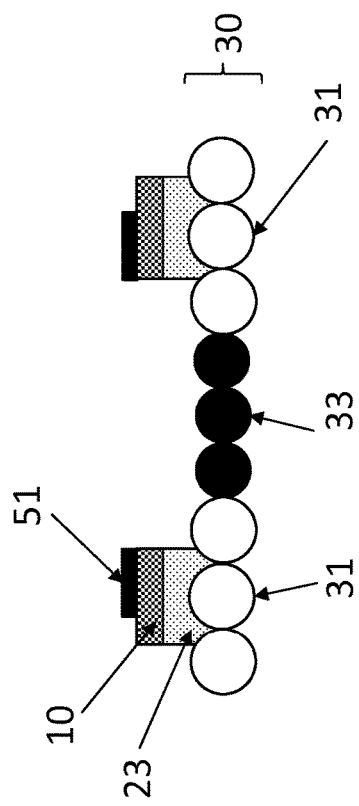
FIG. 11A
FIG. 11B
FIG. 11C

TEXTILE INTEGRATION OF ELECTRONIC CIRCUITS

CROSS-REFERENCE TO RELATED APPLICATIONS

This application is a continuation of PCT Application No. PCT/EP2014/052753, filed Feb. 12, 2014, which claims the benefit of U.S. Provisional Application No. 61/765,533, filed Feb. 15, 2013. Each of the above applications is hereby incorporated by reference in its entirety.

BACKGROUND

Technological Field

The present disclosure relates to a method for integrating electronic circuits with a textile layer containing electrically conductive yarns. More specifically the present disclosure relates to a method of integrating a stretchable interposer with a textile layer. The present disclosure further relates to a textile fabric containing electrically conductive yarns and electronic circuits electrically connected to such electrically conductive yarns.

Description of the Related Technology

Integration of electronic devices or electronic circuits with a textile fabric can add new functionalities to the textile, allowing the realization for example of clothes with integrated sensors, luminous textile or wearable computing.

U.S. Publication No. 2006/0258205 relates to a method for integrating an electric component with a textile including a conductor line system, the conductor line system having an arrangement of a plurality of electric conductor lines, the electric component being connected to specific electric conductor lines. An adapter element is arranged between the electric component and the conductor line system to redistribute the pads of the component to the conductive lines in the textile. The adapter element has at one side a connecting portion that is to be connected to the specific electric conductor lines and on the other side a connecting portion that is to be connected to the electronic component. Connecting points are first prepared in the conductor line system by locally removing the external insulation of the electric conductor lines of the textile. The adapter element is then fixed by means of an adhesive that makes a solid mechanical connection with the basic fabric of the textile. In the portions of the textile connecting points an electrically conductive adhesive is provided which allows for a selective electrical connection between the adapter and the textile. This approach requires that the connecting arrangement of the adapter element is precisely aligned to the arrangement of the conductive lines of the textile in order to avoid faulty connections. However, the alignment accuracy is mainly dependent on the accuracy limitations of the placing tool used. For this reason, the use of this approach may require that the size of the connection points (electrical contacts) is relatively large, so as to compensate for the limited accuracy of the placing tools used for placing the adapter to the desired connection points on the textile. However, increasing the size of the connection points may limit the flexibility of the textile.

In "Contacting electronics to fabric circuits with nonconductive adhesive bonding", T. Linz et al, The Journal of the Textile Institute, Vol. 103, No. 10, October 2012, 1139-1150, a contacting approach based on nonconductive adhesive bonding is proposed. This approach involves the application of pressure to displace an adhesive out of a contacting area and curing of the adhesive at elevated temperature. Because of the use of pressure and an elevated temperature, this process is limited to textile materials that are not damaged by the pressures and/or temperatures used.

SUMMARY OF CERTAIN INVENTIVE ASPECTS

It is an aim of the present disclosure to provide a method for integrating electronic circuits with a textile containing electrically conductive yarns that overcomes the problem of the prior art with regards to the accuracy limitations of the placing tools while maintaining the flexibility of the textile layer.

This aim is achieved according to the present disclosure with the method showing the technical characteristics of the first independent claim.

More in particular according to an embodiment of the present disclosure a method of integrating an interposer device with a textile layer is provided. The method may comprise the step of providing a stretchable interposer device that may contain an electronic component, the stretchable interposer device may comprise at a first side a stretchable electrically conductive structure with at least one contact pad for establishing at least one electrically conductive path towards an electrically conductive yarn of the textile layer. The stretchable interposer may be positioned relative to the textile layer comprising a plurality of yarns, at least one of which is an electrically conductive yarn, such that the at least one contact pad is aligned with the at least one electrically conductive yarn thereby defining at least one contacting location between the interposer device and the textile layer. The stretchable interposer device may be mechanically attached to the textile layer by means of an electrically non-conductive adhesive such as glue or plastic. Once the stretchable interposer device is secured on the textile layer at the desired location, an electrical contact may be established between the at least one contact pad and the at least one electrically conductive yarn at the at least one contacting location. The electrical contact may be established by providing an electrically conductive material at the at least one contacting location so that an electrically conductive contact is formed between the respective contact pad and the respective electrically conductive yarn.

It has been found that performing the step of establishing an electrical contact after the step of mechanically attaching the interposer device to the textile layer may significantly reduce the misalignment issues associated with the accuracy limitations of the tools used for placing the interposer device, which may result in the size reduction of the electrical contacts thereby greatly maintaining the flexibility of the textile layer.

According to an embodiment of the present disclosure, the step of establishing an electrical contact may comprise the step of locally removing, at the contacting locations defined, electrically insulating materials present between the at least one contact pad and the at least one electrically conductive yarn. Locally removing electrically insulating materials may for example comprise locally removing encapsulation material and/or supporting material of the stretchable interposer and/or locally removing an insulating coating of electrically conductive yarns and/or locally removing non-conductive adhesive material used for mechanically attaching the interposer device to the textile layer.

By locally removing the insulating materials after the interposer device is mechanically attached to the textile layer it has the advantage that the contacting location is defined after the interposer device is secured on the textile layer. As a result, it is ensured that any misalignment introduced during any of the previous steps is compensated, which may lead to a further reduction in the size of the electrical contacts. Furthermore, defining the at least one contacting location after the interposer is attached to the textile layer may have as an advantage that the connecting arrangement of the interposer device is not required to be precisely aligned to a specific location of the arrangement of the conductive yarns of the textile. This may result in the relaxation of the alignment requirements between the interposer device and the textile thereby making it possible to use cheaper placing tools with lower alignment accuracy.

According to an embodiment of the present disclosure, the stretchable interposer may comprise a supporting layer arranged for supporting the at least one contact pad. In this case the step of locally removing the insulating materials may comprise the formation of at least one opening on the supporting layer at the at least one contacting location so as to expose the at least one contact pad.

According to an embodiment of the present disclosure, the step of locally removing the insulating material may be performed by means of laser ablation, which may require that the laser is aligned with the location of the contact pads of the interposer so that insulating materials are removed only from the desired contacting locations. The laser alignment may be performed by illuminating the textile, from the side where the interposer is attached, such that the underlying at least one contact pads arranged on the interposer device becomes visible. The laser ablation may be performed either from the textile side or from the first side of the interposer device. By using laser ablation the step of locally removing insulating material may be better controlled such that the insulating materials are only removed from the desired contacting locations which may lead to a further reduction in the size of the electrical contacts required. Furthermore, the use of laser ablation may overcome the problems related to the use of etching chemicals for locally removing insulating material which may negatively react with the textile fabric and/or other material of the structure, such as the metals contacts and the electrically conductive yarns of the textile layer.

According to an embodiment of the present disclosure, the step of mechanically attaching the interposer device to the textile layer may comprise arranging an electrically non-conductive adhesive between the textile layer and the interposer device. For example, a patterned layer of non-cured adhesive material may be provided on the textile layer at locations where the interposer is to be attached, followed by placing the interposer on the layer of adhesive material, and curing the layer of adhesive material. The electrically non-conductive adhesive may be provided either on the textile layer or on the stretchable interposer device. In a further example, a layer of non-cured adhesive material may be provided on a surface of the interposer, followed by placing the interposer on the textile layer with the surface having the non-cured adhesive material layer oriented towards the textile layer, and curing the layer of adhesive material. For example, the electrically non-conductive adhesive material can be a silicone-based material. Furthermore, at least one encapsulation layer may be provided for at least partly encapsulating the interposer device. The encapsulation layer may be made from a non-cured stretchable insulating material, preferably a polymer-based material such as Polydimethylsiloxane (PDMS) or Thermoplastic Polyurethane (TPU). Providing a stretchable encapsulation layer may offer the advantage that the mechanical stress generated during the deformation of textile fabric may be greatly absorbed, such that the reliability of more rigid parts is not affected. For example, the risk of breaking an electrical contact between the at least one contact pad and the at least one conductive yarn during deformation of the textile fabric may be greatly reduced or completely eliminated.

According to an embodiment of the present disclosure, the step of establishing an electrical contact may be performed by providing at the desired contacting location an electrically conductive material for electrically connecting the at least one conductive yarn with the at least one contact pad. For example, a non-cured electrically conductive adhesive material may be provided at each of the contacting locations from the textile side. According to another example, the electrically conductive adhesive may be provided at the contacting locations from the interposer device side. The electrically conductive adhesive may be for example an isotropic conductive adhesive material containing metal particles such as silver particles. The electrically conductive adhesive may be cured at a separate step at a low temperature.

According to embodiments of the present disclosure, the materials of the electrically non-conductive adhesive, and/or encapsulation layer, and/or the electrically conductive adhesive may be chosen such that they can be cured at a low temperature. For example, at a curing temperature, of at least 15.0 degrees, preferably at most 40.0 degrees, more preferably at most 30.0 degrees, and even more preferably at most 25.0 degrees.

The use of material having low curing temperatures may enable the integration of electronic circuits with different types of textile fabrics, since temperature related textile damage can be avoided.

According to an embodiment of the present disclosure, the at least one contact pad arranged on the first side of the stretchable interposer device may be provided in a variety of shapes and sizes. For example, the at least one contact pad may have a ring shape with a central opening. The central opening may be used as an alignment marker for performing the step of locally removing insulating material, for example by means of laser ablation, from the interposer side. Using features of the at least one contact pad as alignment markers may eliminate the need for placing extra alignment markers at different locations on the interposer device thereby reducing the area overhead of the interposer.

According to an embodiment of the present disclosure, the stretchable electrically conductive structure arranged on the interposer device may comprise one or more stretchable interconnects. For example, each stretchable interconnect may comprise a meander-shaped metal track, which is arranged to stretch in response to a deformation of the textile layer. The use of stretchable interconnects may further enhance the absorption of mechanical stress caused during the deformation of the textile layer, which mechanical stress may compromise the reliability of the electrical contacts between the contact pads and the respective conductive yarns. Furthermore, the stretchable interconnects may be embedded in an encapsulation material, wherein the encapsulation material can be removed from between different meandered electrical connections, thereby strongly reducing the contact area between the textile and the integrated interposer and thus better maintaining the mechanical properties of the textile, without affecting the electrical properties of the electrical connections.

According to an embodiment of the present disclosure, the processing steps of the method may be adapted such they are 'textile friendly' so that the risk of damaging the textile is limited or completely eliminated. Furthermore, the processing steps of the method may be performed without applying pressure or at very low pressure and at low temperatures, e.g. at temperatures in the range between about 15° C. and about 40° C. The temperatures used during processing may be selected depending on the type of textile used. For example, in the case of cotton, temperatures up to about 130° C. can be used. For other types of textile temperatures up to about 80° C. may be used. However, in preferred embodiments the temperatures are below 40° C. It is an advantage of an inventive aspect that the chemical steps and chemical materials used (e.g. for adhesion) are not aggressive and thus don't affect the textile properties.

It is an advantage of embodiments of the present disclosure, that the method may be highly textile type independent. For example, it may be used in combination with a broad range of different types of textile. In a further example, the method may be used in combination with different types of carrier textile, such as for example cotton, silk, polyester, etc. In yet another example, the method may be used in combination with different types of conductive yarns, such as conductive yarns comprising conductive wires with or without an insulating coating or conductive yarns comprising a non-conductive core with at least one electrically conductive wire wrapped around it. In yet another example, the method may be used in combination with a textile layer comprising conductive yarns formed for example by ink printing electrically conductive lines on a textile layer.

According to a second aspect of the present disclosure, a textile fabric may be provided, which may comprise a stretchable interposer device integrated with a textile layer of the textile fabric according to the first aspect of the present disclosure.

BRIEF DESCRIPTION OF THE DRAWINGS

The disclosure will be further elucidated by means of the following description and the appended figures.

FIG. 1(a) illustrates a fully encapsulated interposer. FIG. 1(b) illustrates a single side encapsulated interposer.

FIGS. 3(a) and 3(b) show partial cross sections of a device after local laser ablation of insulating layers, for a fully encapsulated interposer (FIG. 3(a)) and for a single side encapsulated interposer FIG. 3(b)).

FIGS. 4(a) and 4(b) show partial cross sections of a device after filling of the laser ablated via with an electrically conductive material in accordance with an inventive aspect, for a fully encapsulated interposer (FIG. 4(a)) and for a single side encapsulated interposer (FIG. 4(b)).

FIG. 6(a) illustrates a fully encapsulated interposer; FIG. 6(b) illustrates a single side encapsulated interposer.

FIGS. 9(a) and 9(b) show partial cross sections of a device after filling of the laser ablated via with an electrically conductive material according to an embodiment of the present disclosure, for a fully encapsulated interposer (FIG. 9(a)) and for a single side encapsulated interposer (FIG. 9(b)), wherein the interposer has a ring shaped contact pad.

FIGS. 10(a) and 10(b) show partial cross sections of a device according to an embodiment of the present disclosure after providing encapsulating insulating layers, for a fully encapsulated interposer (FIG. 10(a)) and for a single side encapsulated interposer (FIG. 10(b)), wherein the interposer has a ring shaped contact pad.

FIG. 11(a) to 11(e) schematically illustrate process steps of a method according to an embodiment of the present disclosure.

DETAILED DESCRIPTION OF CERTAIN ILLUSTRATIVE EMBODIMENTS

Figure 1A:
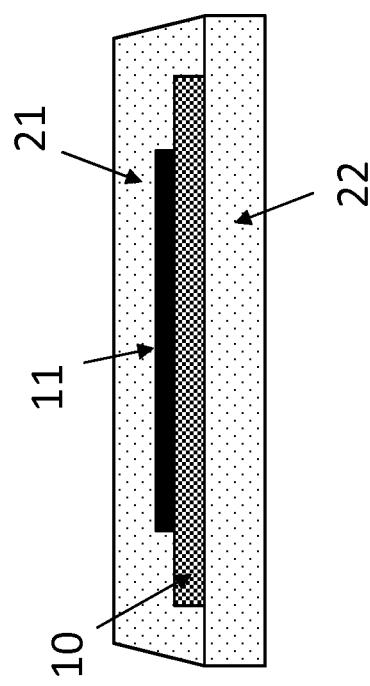
FIGS. 1(a) and 1(b) show partial cross sections of a stretchable interposer that can be used in one embodiment.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In the context of the present disclosure, the term stretchable interposer may be interpreted as a planar stretchable device containing at least one stretchable interconnection and at least one contact pad. The at least one stretchable interconnection and the at least one contact pad may be embedded or encapsulated in a stretchable encapsulation material such as a stretchable polymer. The at least one stretchable interconnection can for example contain meander shaped tracks containing a metal layer, preferably containing a stack of a metal layer and a flexible supporting layer such as a polyimide layer, a PET (polyethylene terephthalate) layer or a PEN (polyethylene naphthalate) layer. Additional layers may be present, such as for example a protective coating covering the metal layer, for example to provide protection against moisture and/or chemicals. In addition to the at least one stretchable interconnection and the at least one contact pad, the stretchable interposer can contain electronic components or electronic circuits, the electronic components or circuits preferably being embedded or encapsulated in a stretchable encapsulation material. Using an interposer that only contains interconnections and contact pads may for example be used for making an electrical connection between two non-crossing conductive yarns of the textile. Each stretchable interconnection may be in electrical contact with at least one contact pad.

In the context of the present disclosure, the term flexible may be interpreted as non-stiff, non-rigid, i.e. bendable but not stretchable. A flexible structure is adapted to be deformable in a certain direction during normal use of the structure, but does not elongate. The length does not change during bending.

In the context of the present disclosure, the term stretchable means may be interpreted as resilient. i.e. elastically deformable with elongation. A stretchable structure is adapted to be elastically deformed during normal use (with elongation).

According to embodiments of the present disclosure a method of integrating a stretchable interposer, e.g. a stretchable interposer containing an electronic circuit, with a textile layer containing electrically conductive yarns may be provided. According to embodiments of the present disclosure a textile fabric comprising a textile layer with electrically conductive yarns and a stretchable interposer, e.g. a stretchable interposer containing an electronic circuit, electrically connected to such electrically conductive yarns may further be provided.

Although the present disclosure is described herein with references to the use a stretchable interposer, the disclosure is not limited thereto. For example, according to embodiments of the present disclosure a flexible interposer may also be used instead of a stretchable interposer.

In a method according to embodiments of the present disclosure, a stretchable interposer may be provided that is designed and optimized for a predetermined textile integrated application. In a first step a mechanical connection may be established between the stretchable interposer and a textile fabric or textile layer, so that the stretchable interposer is mechanically attached to the textile layer. The stretchable interposer may contain at least one contact pad.

The at least one contact pad may for example have a circular shape, but any other suitable shape can be used. The at least one contact pad may contain a metal such as Cu. The diameter of a contact pad may be typically in the range between about 0.5 mm and about 1 mm, the present disclosure not being limited thereto. The stretchable interposer may further comprise stretchable interconnections, such as meandered metal interconnections, e.g. having a track width in the order of about 100 micrometer, in electrical contact with one or more contact pads arranged onto a first side of a stretchable interposer. In preferred embodiments the meandered metal interconnections may contain a stack of layers comprising a metal layer and a supporting layer such as a polyimide layer or any other suitable flexible electrically insulating layer such as a PET layer or a PEN layer. The supporting layer may also be present adjacent to the at least one contact pad, for example the metal layer of the at least one contact pad may be arranged on the supporting layer, which may be a patterned supporting layer. According to embodiments of the present disclosure, a circular contact pad with a diameter larger than the size of the meander tracks may be provided for establishing an electrical contact between the meander tracks and the conductive yarns of the textile fabric. The textile fabric may contain conductive yarns embedded in an insulating material, the present disclosure not being limited thereto. For example, the conductive yarns may have a diameter in the range between about 20 micrometer and about 100 micrometer. Furthermore, the conductive yarns may be arranged in the textile layer at distance from one another, pitch, which may be in the range of about 1 mm and about 5 mm. However, the present disclosure is not limited thereto, and other suitable diameters and/or distances between the conductive yarns may be used.

FIGS. 1(*a*) and 1(*b*) show examples of cross sections of a stretchable interposer according to embodiments of the present disclosure. FIG. 1(*a*) shows an example of a fully, also referred to hereinafter as double side, encapsulated stretchable interposer having a stretchable electrically non-conductive encapsulation layer at both sides of the interposer. FIG. 1(*b*) shows a cross section of a further example of a stretchable interposer where a single side encapsulated interposer is provided with the encapsulation layer arranged only at one of the interposer sides. The encapsulation layer may be a polymer material, which can be either cured or un-cured, such as PDMS (Polydimethylsiloxane) or a TPU (Thermoplastic Polyurethane). FIG. 1(*a*) shows a cross section of an interposer according to embodiments of the present disclosure, comprising a patterned flexible electrically non-conductive supporting layer 10 (such as a polyimide layer or a PET or PEN layer and a contact pad 11 arranged on the supporting layer 10. For example the supporting layer 10 and the contact pad 11 may be fully encapsulated by a first encapsulation layer 21 provided at a first side of the interposer and a second encapsulation layer 22 provided at a second side of the interposer. The interposer may comprise additional layers, such as for example a protective layer or a coating layer (not shown) arranged for protecting the contact pad 11 and/or other metal layers provided at a side opposite to the side of the supporting layer 10. FIG. 1(*b*) shows a cross section of a single side encapsulated interposer according to embodiments of the present disclosure having a supporting layer 10, contact pad 11 and a first encapsulation layer 21 arranged at the first side of the interposer.

According to embodiments of the present disclosure, the interposer may be single side encapsulated by providing a second encapsulation layer at the second side of the interposer and no encapsulation layer on the first side. In other embodiments (not shown) the interposer may comprise a double sided flex board, with contact pads 11 at both sides of the supporting layer 10. In still other embodiments, a part of the interposer containing electronic components or electronic circuits may be encapsulated, and another part of the interposer containing contact pads may be non-encapsulated. In other embodiments the interposer may be non-encapsulated.

Figure 12:
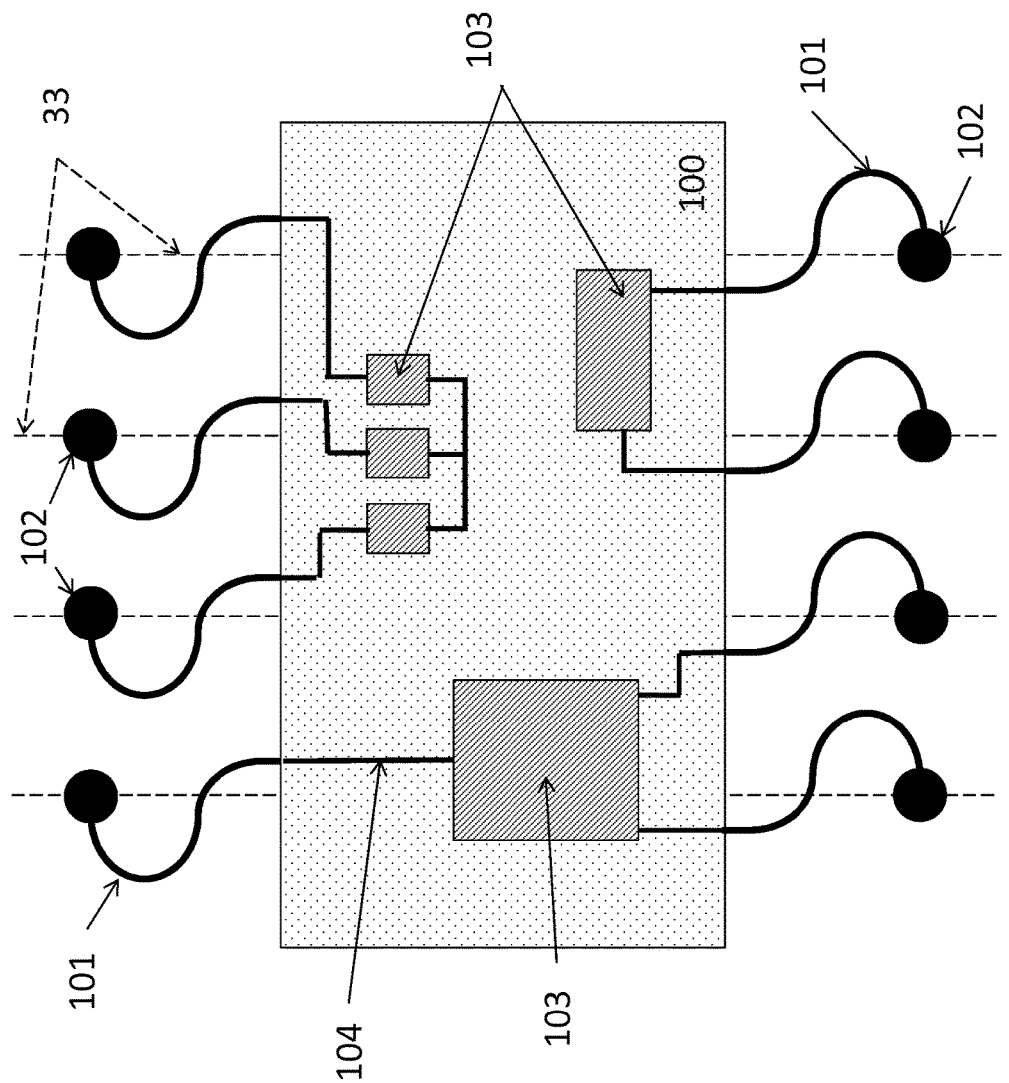
FIG. 12 schematically shows an example of an interposer as may be used in a method of the present disclosure.

FIG. 12 schematically shows an example of a stretchable interposer according to embodiments of the present disclosure. In the example shown, the interposer comprises stretchable interconnections 101, each stretchable interconnection being connected to a contact pad 102. The interposer further contains electronic components 103, the electronic components 103 being electrically connected to at least one contact pad 102 by a corresponding stretchable interconnection 101 and electrically conductive tracks 104. The electrically conductive tracks 104 are shown in FIG. 12 as straight lines, but they may have a different shape, such as for example a meander shape. In the example shown in FIG. 12, the stretchable interposer is partially encapsulated in an encapsulation material 100. The dashed lines 33 in FIG. 12, which are not part of the interposer, schematically represent electrically conductive wires of a textile layer to which the contact pads 102 of the interposer may be connected according to embodiments of the present disclosure.

By using a double side encapsulated interposer as shown in FIG. 1(a) damage to the stretchable interposer, e.g. due to mechanical or chemical influences, can be avoided. The risk of damage to the interposer may for example be related to the environment where the interposer is stored between its production and the integration process and to the time interval between production and integration.

Figure 1B:
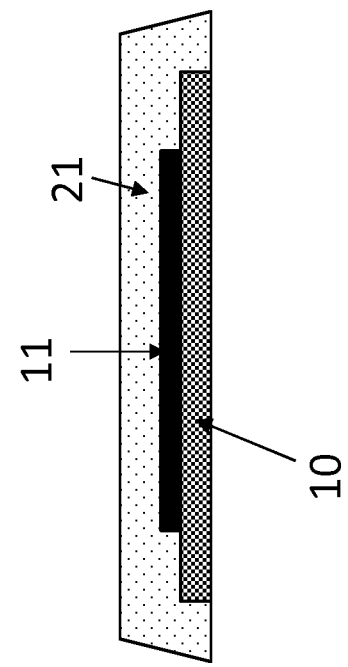

The use of a single side encapsulated interposer, such as the one shown in FIG. 1(b), may have as an advantage that the production cost of the textile integration can be substantially reduced. The cost reduction may be achieved due to the reduced number of processing steps, lower use of material quantities, and less insulating material to be removed, as described herein.

Furthermore, the use of a partially encapsulated interposer may further enable the removal of any electrically insulating material before attaching the stretchable interposer to the textile layer. For example, in the case where an interposer similar to the one shown in FIG. 12 is combined with a textile layer containing electrically conductive yarns without insulating coating, the insulating material of the interposer may be removed prior to the step of mechanically attaching the interposer to the textile. Therefore, the use of partially encapsulating interposer devices may eliminate the need for removing insulating material after the interposer has been mechanically attached to the textile, for example by means of laser processing, i.e. no need for a dedicated laser.

According to an embodiment of the present disclosure, the stretchable interposer may be firstly mechanically attached to a textile layer. Hereinafter it is assumed that the interposer is attached with its second side i.e. the side of the supporting layer 10 facing the textile layer. However, the present disclosure is not limited to this embodiment and the interposer may also be attached with its first side facing the textile layer i.e. the side where the metal layers are arranged.

According to an embodiment of the present disclosure, the step of mechanically attaching the interposer device to the textile may comprise the step of providing a first mask on the textile layer, e.g. by providing a patterned foil or mask having openings at the desired locations where a stretchable interposer is to be attached. An electrically non-conductive adhesive material may then be provided on the mask or foil, e.g. by casting or screen printing. The non-conductive adhesive material may preferably be a polymer material that can be cured at low temperatures, such as e.g. at a temperature in the range between about 15° C. and about 40° C. For example, the adhesive material may be a silicone material, an acrylic material or an epoxy material. After removing the mask, a patterned layer of non-cured adhesive may be present at the locations where the interposer is to be attached. Next the interposer may be placed on the layer of uncured adhesive, and the adhesive is cured, e.g. by UV curing or by curing at a suitable curing temperature. The curing temperature can be selected based on the type of textile used in the process. For example, when using a cotton textile the curing temperature may be as high as 130° C. For other textile materials the curing temperature may be lower than about 40° C., e.g. not higher than about 25° C. It may be an advantage of using higher curing temperatures that the curing time may be shorter.

Figure 2A:
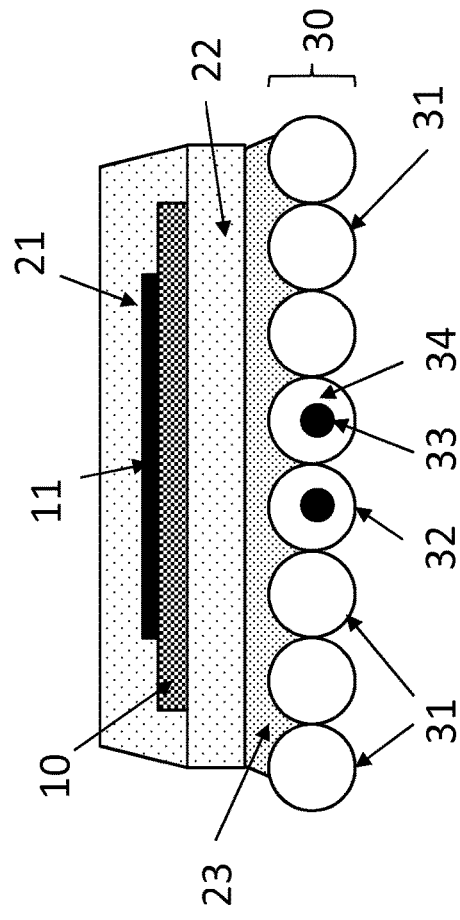
FIGS. 2(a) and 2(b) show partial cross sections of a stretchable interposer mechanically attached to a textile layer by means of an adhesive, for a fully encapsulated interposer (FIG. 2(a)) and for a single side encapsulated interposer (FIG. 2(b)).
Figure 2B:
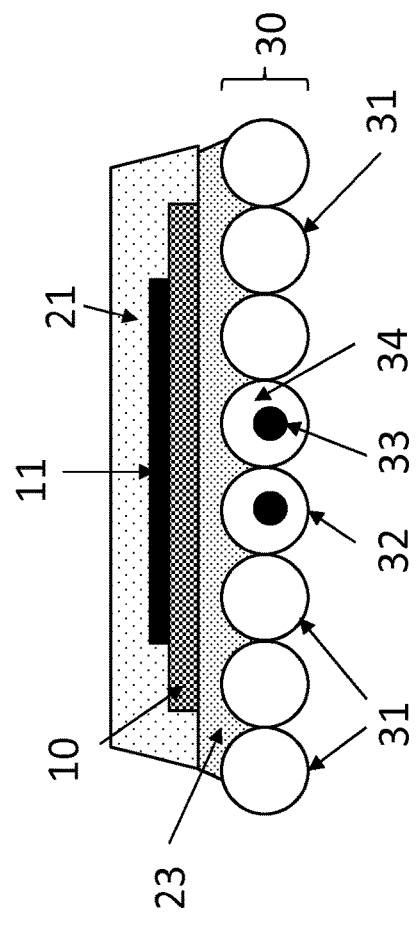

FIGS. 2(a) and 2(b) show different examples of a structure resulting from the integration of a stretchable interposer with a textile layer 30. FIG. 2(a) shows a double side encapsulated interposer integrated with a textile layer 30. FIG. 2(b) shows a single side encapsulated interposer integrated with a textile layer 30. FIGS. 2(a) and 2(b) show the cured adhesive layer 23 between the interposer and the textile layer 30, the textile layer containing a combination of non-conductive yarns 31 and electrically conductive yarns 32. However, other types of textile may be used according to embodiments of the present disclosure, comprising only electrically conductive yarns 32. In the example shown in FIGS. 2(a) and 2(b), the electrically conductive yarns 32 comprise a conductive wire 33 and an electrically insulating encapsulation or coating 34. The electrically insulating coating 34 may for example be made from a thermoplastic material such as polyurethane.

It is noted that the figures show a cross-section of the textile layer 30 and the interposer device at the location of a single contact pad 11 of the interposer. In practical applications the interposer may comprise a plurality of contact pads 11. In addition, the interposer may comprise stretchable interconnections 101 and electronic devices or electronic circuits 103 as illustrated in the example shown in FIG. 12. In practical applications the lateral dimensions of the textile layer may be much larger than the lateral dimensions of the interposer.

According to an embodiment of the present disclosure, the step of mechanically attaching the interposer to the textile layer may be performed by providing a layer of uncured adhesive on the stretchable interposer rather than on the textile layer. For example, after the adhesive layer is applied on the stretchable interposer, the interposer may be positioned on the textile layer at a predetermined location, and the adhesive layer is cured. By providing the adhesive layer on the stretchable interposer it may eliminate the need for providing a dedicated mask. At a next step, insulating material may be removed at contacting locations where an electrical contact is to be made between a conductive wire 33 of the textile layer 30 and a contact pad 11 of the stretchable interposer. The step of removing the insulating material may be performed by laser ablation. It is an advantage of using laser ablation that there is no need for using chemicals that may interact with the textile. The laser ablation may for example be done from the textile side of the structure. In the examples shown in the figures, the following materials may be removed locally during the step of locally removing insulating materials: the insulating coating 34 of the conductive yarn, the non-conductive adhesive layer 23 between the stretchable interposer and the textile layer 30, the second encapsulation layer 22 if present, and the non-conductive flexible supporting layer 10.

According to an embodiment of the present disclosure, the laser ablation may be performed by a YAG laser arranged for removing thermoplastic materials and polyimide. However, the YAG laser may be less preferable for removing PDMS materials, such as for example the material used for the second encapsulation layer 22. In preferred embodiments the different insulating layers may be removed by means of a CO2 laser. It is an advantage of using a CO2 laser that it allows good removal of the different materials in a time efficient way. It is an additional advantage of the use of CO2 laser in that it does not significantly affect the properties of the metals layers used, e.g. the metals forming the conductive yarns and forming the contact pads.

FIGS. 3(a) and 3(b) show different examples of a structure according to embodiments of the present disclosure after the step of locally removing insulating material has been performed, for example by means of laser ablation. FIG. 3(a) shows an example of a resulting structure comprising a double side encapsulated interposer. FIG. 3(b) shows a further example of a resulting structure comprising a (single sided) encapsulated interposer. It is an advantage of removing the different materials from the textile side of the structure that the first encapsulation layer 21 may serve as a protection layer, e.g. against moisture. The first encapsulation layer 21 also may serve as an insulator at the first side of the interposer. The non-conductive adhesive layer 23 and the electrically insulating coating 34 may act as an insulator at the sidewalls of the opening made by the laser ablation step.

According to embodiments of the present disclosure, the step of locally removing insulating material by means of a laser may require that the laser is aligned with the contact pad 11 of the interposer. In the case where the interposer device comprises a supporting layer 10, a via or opening may be formed at the desired location during the step of locally removing the insulating material such that the contact pad can be accessed. The size of the opening or via made through the different layers may preferably be smaller than the size of the contact pad 11, such that the contact pad 11 extends at all sides over the edges of the via. For example, the via diameter may be about 100 micrometer smaller than the diameter of the contact pad. However, the present disclosure is not limited thereto and the via may have different diameters. The via may be filled at a subsequent step with an electrically conductive material, such as e.g. an electrically conductive adhesive, to establish an electrical connection between the contact pad 11 of the interposer and the exposed electrically conductive wires 33 of the conductive yarns. Preferably the time interval between the step of locally removing the insulating material and the step of filling the via may be sufficiently short to avoid or limit oxidation of the exposed conductive surfaces.

In the examples described herein, filling of the via with a conductive adhesive material may be performed from the textile side of the structure. For example, filling of the via may be done by dispensing an electrically conductive adhesive material, followed by curing. FIGS. 4(a) and 4(b) show different examples of a structure according to embodiments of the present disclosure, after the steps of filling the via with a conductive adhesive material 35 and curing have been performed. FIG. 4(a) shows an example of a resulting structure comprising a double side encapsulated interposer. FIG. 4(b) shows a further example of a resulting structure comprising a single side encapsulated interposer.

Figure 5A:
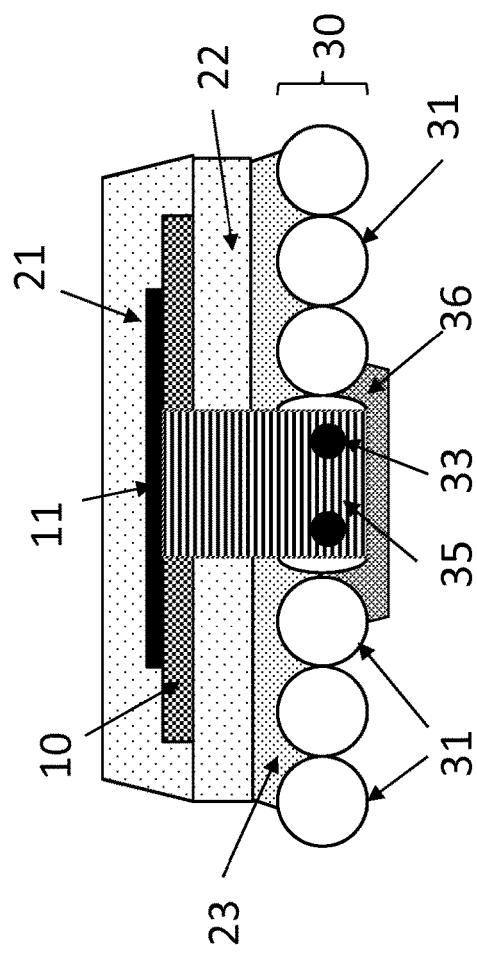
FIGS. 5(a) and 5(b) show partial cross sections of a device according to an inventive step after providing an insulating layer, for a fully encapsulated interposer (FIG. 5(a)) and for a single side encapsulated interposer (FIG. 5(b)).
Figure 5B:
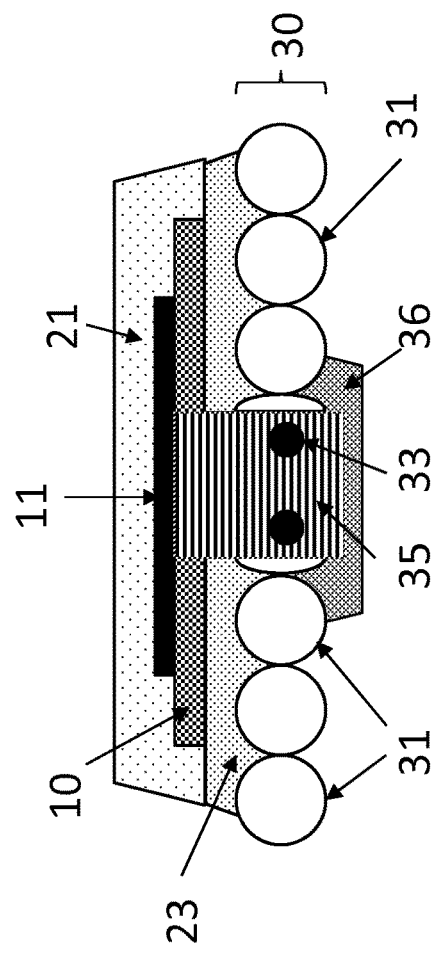

According to embodiments of the present disclosure, an electrically insulating layer 36, such as a PDMS layer, may be provided at a subsequent step for locally encapsulating the textile layer at the locations where the adhesive material 35 is exposed. The encapsulation layer 36 may further be cured so that a totally insulated device may be obtained, which is protected e.g. against external influences such as mechanical influences, humidity or chemicals. Preferably the insulating layer 36 may be provided such that it fully covers the exposed area of the adhesive material 35 thereby overcoming the insulation problems resulting from moisture penetrating from neighbouring yarns. FIGS. 5(a) and 5(b) show different examples of the resulting structure having an encapsulation layer at the locations where the adhesive layer is exposed. FIG. 5(a) shows an example of a resulting structure comprising a double side encapsulated interposer. FIG. 5(b) shows an example of a resulting structure comprising (single side) encapsulated interposer.

According to an embodiment of the present disclosure, the step of locally removing the insulating materials by means of laser ablation may be performed from the interposer side rather than the textile side. In such embodiments a stretchable interposer may be used comprising contact pads having a shape with an opening, e.g. a central opening, such as a ring shape.

Figure 6C:
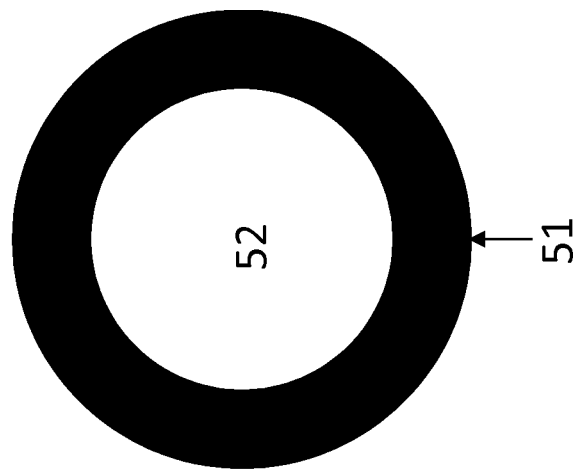
FIG. 6(c) shows a top view of a ring shaped contact pad.
Figure 6A:
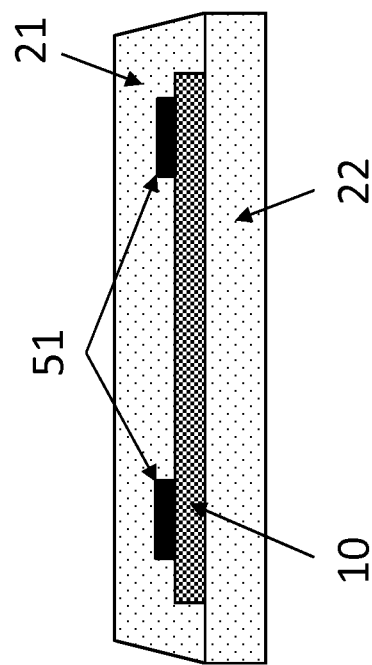
FIG. 6(a) and FIG. 6(b) show a partial cross section of a stretchable interposer with a ring shaped contact pad, as can be used in one embodiment.
Figure 6B:
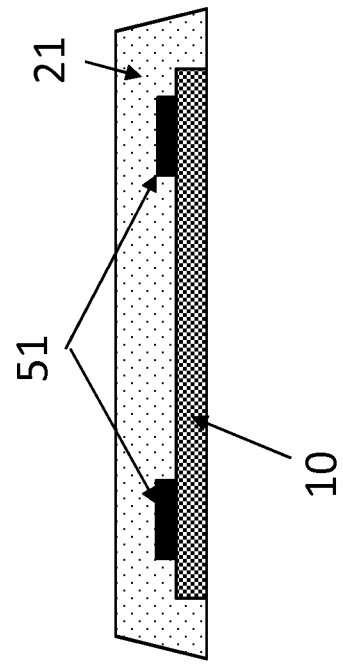

FIGS. 6(a) and 6(b) show cross sections of stretchable interposers comprising a contact pad 51 having a shape with an opening. The figures only show the interposer at the location of a single contact pad 51. In practical applications the interposer may contain a plurality of contact pads 51. In addition, the stretchable interposer may contain stretchable interconnections 101 and it may also contain electronic components or devices and/or electronic circuits 103 as illustrated in the example shown in FIG. 12. FIG. 6(c) shows a top view of a contact pad 51 having a ring shape with a central opening 52. The stretchable interposer may be double side encapsulated, as shown in the cross section of FIG. 6(a), or it may be encapsulated only at the first side, as shown in the cross section of FIG. 6(b). In other embodiments (not shown) an interposer may have only a second encapsulation layer provided at the second side of the interposer and no encapsulation layer at the first side. In other embodiments (not shown) the interposer may contain a double sided flex board, with contact pads 51 at both sides of the supporting layer 10.

Figure 7A:
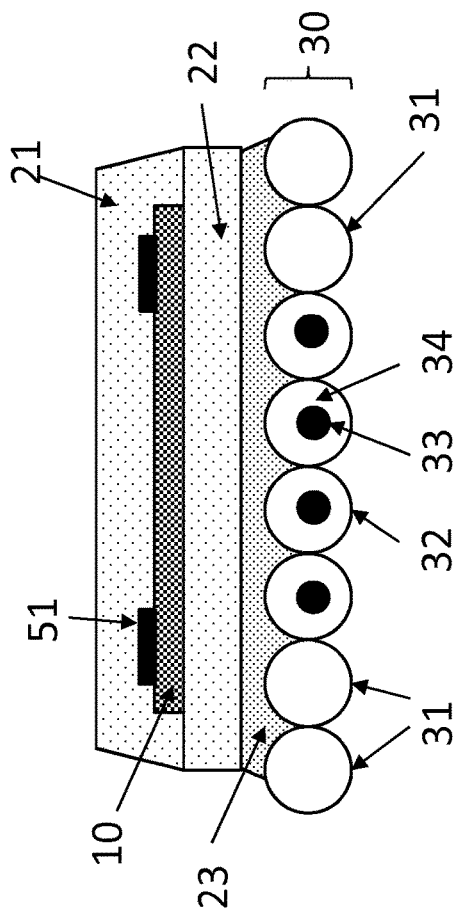
FIGS. 7(a) and 7(b) show partial cross sections of a stretchable interposer mechanically attached to a textile layer by means of an adhesive, for a fully encapsulated interposer (FIG. 7(a)) and for a single side encapsulated interposer (FIG. 7(b)), wherein the interposer has a ring shaped contact pad.
Figure 7B:
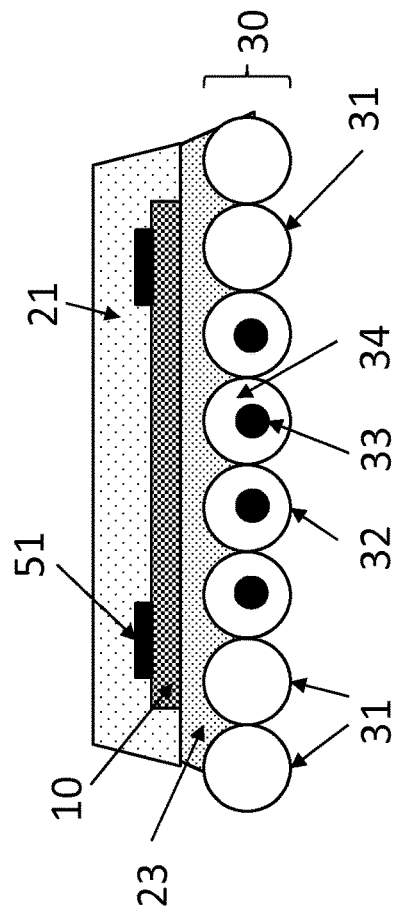
Figure 8A:
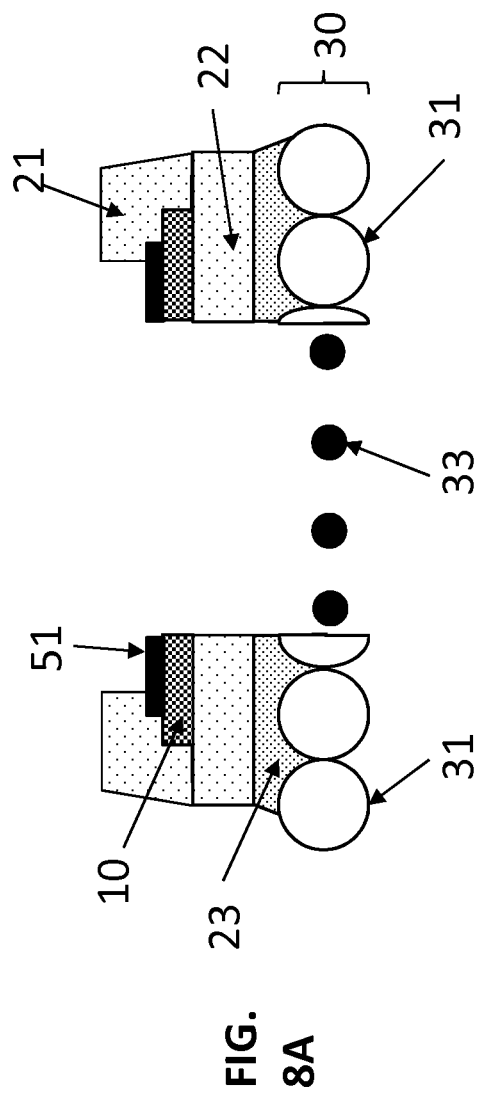
FIGS. 8(a) and 8(b) show partial cross sections of a device after local laser ablation of insulating layers, for a fully encapsulated interposer (FIG. 8(a)) and for a single side encapsulated interposer FIG. 8(b)), wherein the interposer has a ring shaped contact pad.
Figure 8B:
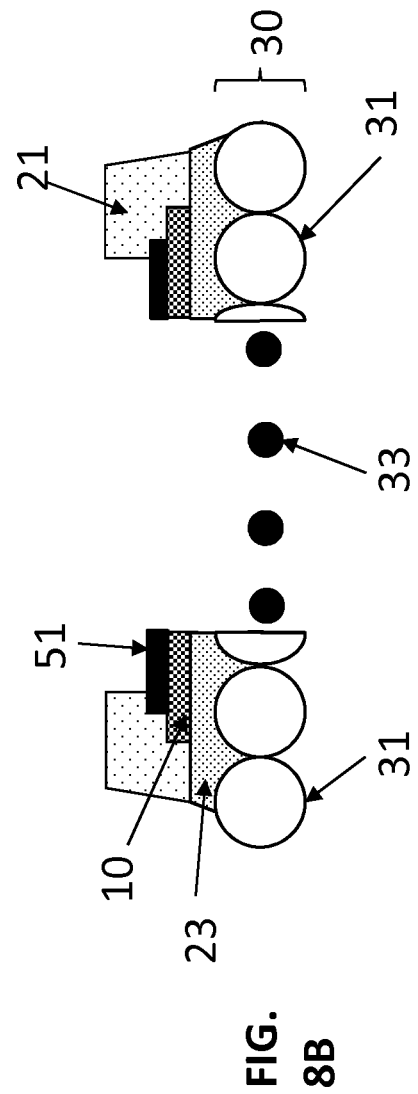

FIGS. 7(a) and 7(b) show different examples of a structure according to embodiments of the present disclosure. The stretchable interposer may be mechanically attached to a textile layer as described above. An electrically non-conductive adhesive layer may be provided either at the second side of the stretchable interposer or on the textile layer. The stretchable interposer may be positioned on the textile layer at a predetermined location after which the adhesive layer may be cured. FIGS. 7(a) and 7(b) show exemplified cross sections of the resulting structure for a double side encapsulated interposer, as shown in FIG. 7(a), and for a single side encapsulated interposer, as shown in FIG. 7(b). At a next step, insulating material may be removed at locations where a contact is to be made between a conductive wire 33 of the textile layer 30 and contact pad 51 of the stretchable interposer, thereby forming a via. For example, the removal of the insulating material may be performed using laser ablation. In the examples described herein, the laser ablation may be performed from the interposer side of the structure, i.e. the side opposite to the textile side of the structure. In the examples described herein, the following materials may be locally removed during the step of locally removing insulating materials: the first encapsulation layer 21, the non-conductive flexible supporting layer 10, the second encapsulation layer 22 if present, the non-conductive adhesive layer 23 between the stretchable interposer and the textile layer, and the insulating coating 34 of the conductive yarn. The ring shaped contact pad may be used as an alignment marker (element) or mask for the laser ablation step. Furthermore, the laser ablation parameters are adapted such that only insulating materials are removed thereby minimizing the impact of laser ablation to the metals. FIGS. 8(a) and 8(b) show different examples of a structure according to embodiments of the present disclosure after laser ablation has been performed. FIG. 8(a) shows an example of a resulting structure comprising a double side encapsulated interposer. FIG. 8(b) shows an example of a resulting structure comprising a (single side) encapsulated interposer. It is an advantage of using a contact pad having a shape with an opening and of performing the laser ablation from the interposer side that it allows a good and easy alignment of the laser with the contact pad.

At a next step, the via formed by the laser ablation step may be filled with an electrically conductive material. e.g. an isotropic conductive adhesive, to establish an electrical connection between the contact pad 51 of the interposer and the exposed electrically conductive wires 33. FIGS. 9(a) and 9(b) show different examples of a resulting structure after the steps of filling the via has been performed. FIG. 9(a) shows an example of a resulting structure comprising a double side encapsulated interposer. FIG. 9(b) shows a further example of a resulting structure comprising a (single side) encapsulated interposer.

Preferably, at a next step insulating layers may be provided at both sides of the structure to avoid penetration of moisture that could cause electrical shorts in the electronic devices arranged in the interposer device. FIGS. 10(a) and 10(b) show examples of providing insulating material on both sides of the structure for a double side encapsulated interposer and for a single side encapsulated interposer respectively.

FIGS. 11(a) to 11(e) show further examples of the structure according to an embodiment of the present disclosure, where a partially encapsulated stretchable interposer may be used, such as the interposer shown in FIG. 12, whereby the encapsulation layer may be provided such that the part of the interposer containing contact pads is not encapsulated while the part of the interposer containing electronic components or electronic circuits may be encapsulated. Alternatively, a non-encapsulated interposer may be used.

FIG. 11(a) shows a cross section of an interposer at the location of a contact pad 51, comprising a metal layer with an underlying supporting layer 10, and FIG. 11(b) shows a corresponding top view. In practical applications the interposer may contain a plurality of contact pads 51. In the example shown, the contact pad 51 has a circular shape with a central opening 52.

As previously discussed, a partially encapsulated interposer may for example be obtained by first fabricating a fully encapsulated interposer, and then locally removing, for example by means of laser ablation, the encapsulation material and any other insulating material that may be present between the contact pad 51 and the side of the interposer to be attached to the textile. A partially encapsulated interposer may also be obtained directly, for example by partially encapsulating the interposer.

The partially encapsulated stretchable interposer may be mechanically attached to a textile layer by means of an electrically non-conductive adhesive layer. Preferably a layer of uncured adhesive material may be provided at the side of the stretchable interposer to be attached to the textile layer. The stretchable interposer may then be positioned on the textile layer at a predetermined location and the adhesive layer is cured. A cross section of the resulting structure is shown in FIG. 11(c), showing the cured adhesive layer 23 between the interposer and the textile layer 30. In the example of FIG. 11(c), the textile layer comprises electrically non-conductive yarns 31 and electrically conductive wires 33 without insulating coating. Other types of textile and other types of conductive yarns may be used such as textile layer comprising a conductive wire with an insulating coating. It is an advantage of using a textile layer comprising electrically conductive wires without insulating coating that there is no need for removing insulating material after attachment of the interposer to the textile layer 30.

Figure 11D:
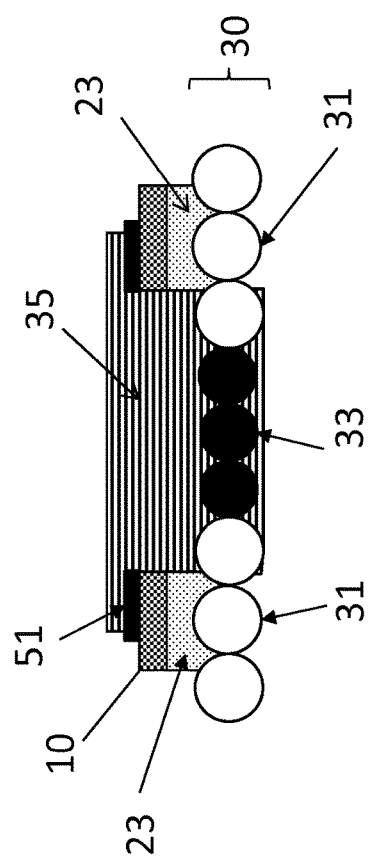

In a further step, an electrically conductive material, e.g. an isotropic conductive adhesive, may be provided at the location of the contact pad to establish an electrical connection between the contact pad 51 of the interposer and the electrically conductive wires 33. This step may be performed by dispensing a conductive adhesive material at the desired location, followed by curing. FIG. 11(d) shows the an example of the structure after this process step, where the cured conductive adhesive material 35 electrically connects the contact pad 51 with the electrically conductive wires 33.

Figure 11E:
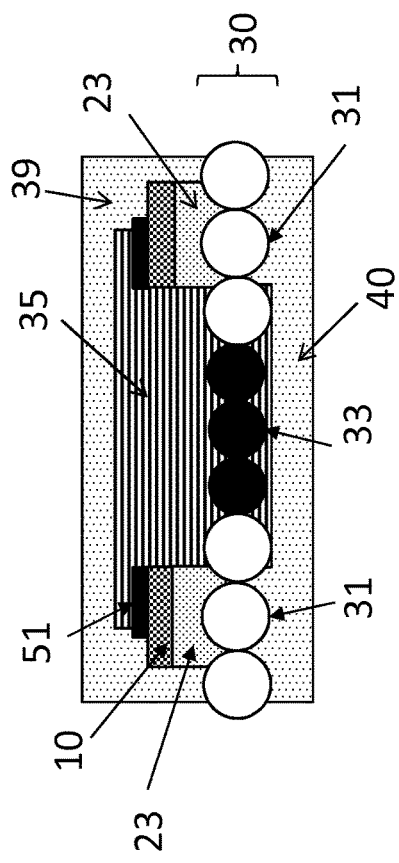

Insulating layers, for example PDMS layers or polyurethane layers, may further be provided at both sides of the structure to provide mechanical protection and to avoid penetration of moisture that could cause electrical shorts in the electronic devices. FIG. 11(e) shows the structure having a first insulating layer 39 at the first side and a second insulating layer 40 at the second side.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of integrating a stretchable interposer device with a textile layer, the method comprising:
   providing the textile layer, the textile layer comprising a plurality of yarns, the yarns comprising at least one electrically conductive yarn;
   providing the interposer device comprising electrically insulating materials and a stretchable electrically conductive structure comprising at least one contact pad for establishing at least one electrically conductive path towards the at least one electrically conductive yarn of the textile layer;
   positioning the interposer device such that the at least one contact pad of the electrically conductive structure is aligned with the at least one electrically conductive yarn of the textile layer, thereby defining at least one contacting location between the interposer device and the textile layer;

mechanically attaching the interposer device to the textile layer; and establishing an electrical contact between the at least one contact pad and the at least one electrically conductive yarn at the at least one contacting location, wherein establishing an electrical contact is performed after mechanically attaching the interposer device to the textile layer and wherein establishing an electrical contact comprises laser ablating, at the at least one contacting location, electrically insulating materials present between the at least one contact pad and the at least one electrically conductive yarn to form a via, and filling the via with an electrically conductive material at the at least one contacting location so that an electrically conductive contact is formed between the respective contact pad and the respective electrically conductive yarn.

2. The method according to claim 1, wherein the interposer device comprises a supporting layer.

3. The method according to claim 2, wherein laser ablating the insulating materials comprises the formation of at least one via in the supporting layer at the at least one contacting location.

4. The method according to claim 1, wherein the interposer device is mechanically attached to a first side of the textile layer, and wherein the laser ablation is performed from a second side of the textile layer opposite the first side.

5. The method according to claim 1, wherein the interposer device is mechanically attached to a first side of the textile layer, and wherein the laser ablation is performed from the first side of the textile layer.

6. The method according to claim 1, wherein mechanically attaching the interposer device to the textile layer comprises arranging an electrically non-conductive adhesive between the textile layer and the interposer device.

7. The method according to claim 6, wherein mechanically attaching the interposer device to the textile layer further comprises curing the electrically non-conductive adhesive, thereby providing a permanent bond between the textile layer and the interposer device.

8. The method according to claim 1, wherein the interposer device is mechanically attached to a first side of the textile layer, and wherein providing an electrically conductive material at the predetermined contact location is performed from a second side of the textile layer opposite the first side.

9. The method according to claim 8, wherein the electrically conductive material is an isotropic conductive adhesive material comprising metal particles.

10. The method according to claim 1, wherein providing an electrically conductive material at the predetermined contact location comprises curing the electrically conductive material for providing a permanent bond between the respective contact pad and the respective electrically conductive yarn.

11. The method according to claim 1, wherein the method further comprises providing at least one encapsulation layer for at least partly encapsulating the interposer device.

12. The method according to claim 11, wherein the encapsulation layer is made from a stretchable insulating polymer-based material.

13. The method according to claim 11, wherein the method further comprises curing the at least one encapsulating layer.

14. The method according to claim 7, wherein the curing is performed at a curing temperature of at least 15° C. and at most 25° C.

15. The method according to claim 10, wherein the curing is performed at a curing temperature of at least 15° C. and at most 25° C.

16. The method according to claim 13, wherein the curing is performed at a curing temperature of at least 15° C. and at most 25° C.

17. The method according to claim 1, wherein the at least one contact pad has a central opening.

18. The method according to claim 17, wherein the central opening is used as an alignment marker for locally removing, at the at least one contacting location, electrically insulating materials present between the at least one contact pad and the at least one electrically conductive yarn.

19. The method according to claim 1, wherein the stretchable electrically conductive structure comprises at least one stretchable interconnect.

20. The method according to claim 19, wherein the at least one stretchable interconnect comprises a metal track which follows a meandering path.

* * * * *